United States Patent
Johnson

(12) 
(10) Patent No.: US 6,276,588 B1
(45) Date of Patent: Aug. 21, 2001

(54) INSERT-TYPE CUTTING BLADE FOR ULTRASONIC BONDING WIRE TERMINATION

(75) Inventor: Glenn D. Johnson, Chula Vista, CA (US)

(73) Assignee: International Rectifier Corp., El Segundo, CA (US)

(*) Notice: Subject to any disclaimer, the term of this patent is extended or adjusted under 35 U.S.C. 154(b) by 0 days.

(21) Appl. No.: 09/552,843

(22) Filed: Apr. 20, 2000

Related U.S. Application Data

(60) Provisional application No. 60/130,140, filed on Apr. 20, 1999.

(51) Int. Cl.[7] .................................................. B23K 1/06
(52) U.S. Cl. ............................................ 228/13; 228/110.1
(58) Field of Search ............................... 228/13, 212, 14, 228/213, 110.1, 170; 30/68, 69, 349, 351; 269/95, 101, 47, 48

(56) References Cited

U.S. PATENT DOCUMENTS

| | | | |
|---|---|---|---|
| 1,119,122 | * | 12/1914 | Schaefer . |
| 3,651,568 | * | 3/1972 | Barry et al. . |
| 3,765,089 | * | 10/1973 | Ibata . |
| 4,180,110 | * | 12/1979 | Tauscher . |
| 4,411,068 | * | 10/1983 | Theodorides . |
| 5,365,657 | * | 11/1994 | Brown et al. . |

\* cited by examiner

*Primary Examiner*—Tom Dunn
*Assistant Examiner*—Jonathan Johnson
(74) *Attorney, Agent, or Firm*—Ostrolenk, Faber, Gerb & Soffen, LLP

(57) ABSTRACT

A cutting blade assembly for an ultrasonic wire bonding machine has a replaceable carbide cutting blade so that the entire blade assembly need not be replaced after a given amount of blade wear.

4 Claims, 2 Drawing Sheets

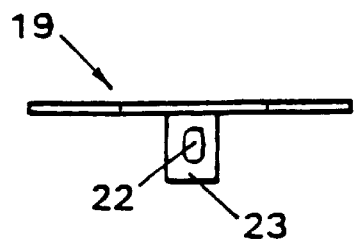
FIG. 3
FIG. 4
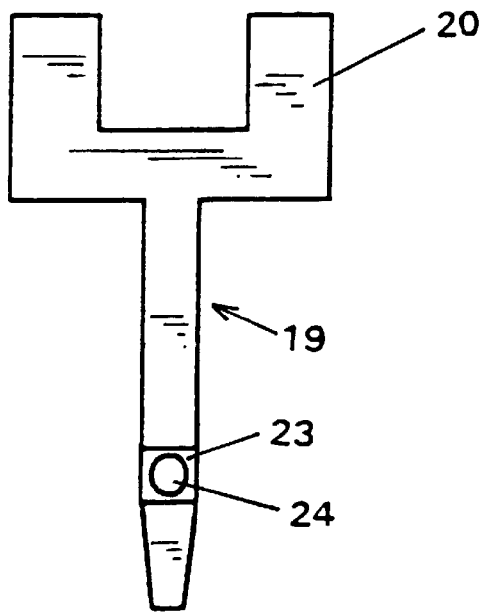
FIG. 5
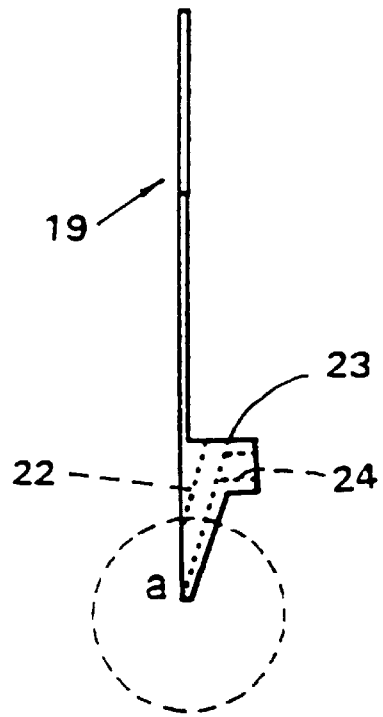
FIG. 7
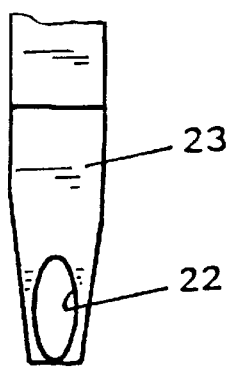
FIG. 6
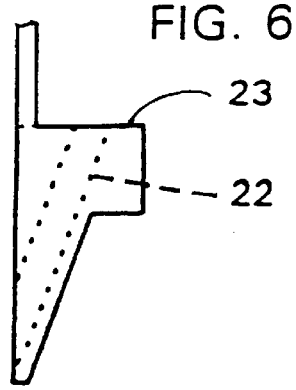

INSERT-TYPE CUTTING BLADE FOR ULTRASONIC BONDING WIRE TERMINATION

CROSS REFERENCE TO RELATED APPLICATION

This application is based on and claims priority to U.S. Provisional patent application Ser. No. 60/130,140, filed Apr. 20, 1999, the entire disclosure of which is hereby incorporated by reference.

BACKGROUND OF THE INVENTION

This invention relates to ultrasonic bonders for bonding aluminum wire to a semiconductor die and to a terminal therefore, and more specifically relates to an improved cutting blade for such devices. A prior art ultrasonic wire bonding process utilizes a cutting blade to terminate (cut) the wire after completing the final bond. The cutting blade cuts completely through the wire using the bonding post of the device lead frame as a surface to cut against.

More specifically, an Orthodyne 360c/HD automatic wire bond machine has been configured to wire bond power transistors bonded on a 20–30 unit copper lead frame, using a magazine to magazine handling system. These machines bond aluminum wire ranging from 0.005" to 0.015" in diameter using ultrasonic technology. The model 360c/HD is actually two single head machines connected together to form the dual head machine necessary to process power transistors that require two different wire sizes.

A bonded wire consists of a source bond and a destination bond. After the final bond (or destination bond) has been completed, the wire needs to be terminated (cut) thus completing the bonding process.

Due to the nature of the process, the cutting blade, which is integral with its support, wears out quickly. The integral cutting blades are typically replaced after every 100,000 cuts (two days), and each Orthodyne machine uses two blades. The cost of this cutting blade is currently $34.00 from the equipment manufacturer. Annual usage for a single duel head machine is 365 blades, at a cost of $12,410.00. Installations will typically have a large number of such machines. It would be desirable to reduce the cost of such cutting blades without affecting their operation.

BRIEF DESCRIPTION OF THE INVENTION

In accordance with the invention, a novel insert type cutting blade is provided which performs as well as the solid blade, but costs only $5.00. Thus, in accordance with the invention the blade support is separate from the actual cutter which is a simple insert easily removed from and connected in place in the blade support.

BRIEF DESCRIPTION OF THE DRAWINGS

FIGS. 3, 4 and 5 are front, side and top views respectively of the blade of FIG. 2.

FIGS. 6 and 7 are enlarged views "a" of the structure of FIG. 5.

DETAILED DESCRIPTION OF THE DRAWINGS

Figure 1:
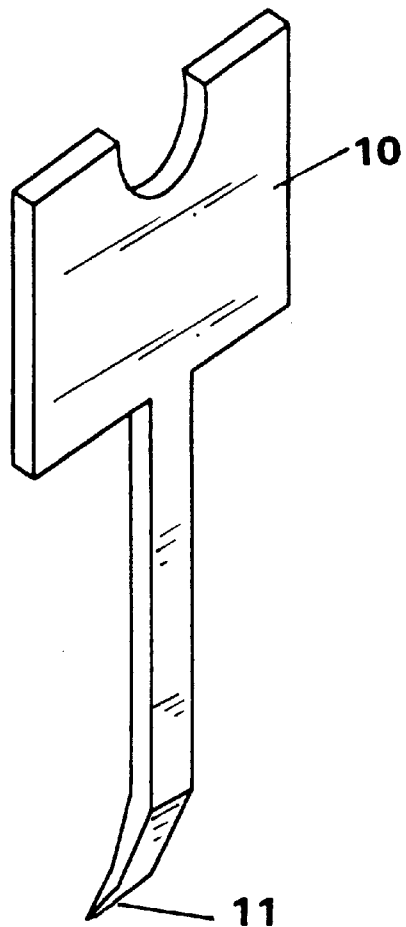
FIG. 1 is a perspective view of a prior art solid type cutting blade which is integral with its support.

FIG. 1 shows the conventional solid type integral cutting blade and support having an enlarged fastening portion 10 for clamping the assembly to the wire bonder and a cutting edge 11. When the blade 11 dulls, the entire assembly must be replaced.

Figure 2:
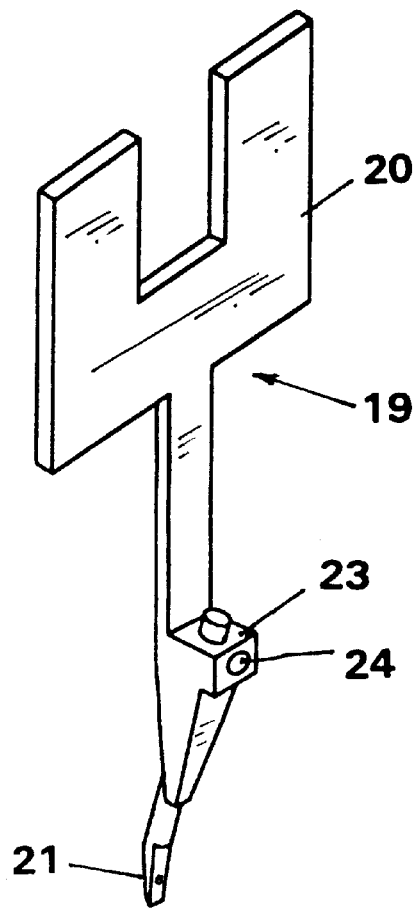
FIG. 2 is a perspective view of the novel insertion type cutting blade of the invention in which the cutter is removable from the support body.

FIG. 2 shows the insert type cutting blade of the invention having a blade support body 19 which has an enlarged fastening portion 20 and a removable insert cutter blade 21.

FIGS. 3 to 7 show the details of the novel assembly of support body 19 and insert cutting section 21. Note that body 19 has a removable blade clamp or boss section 23 which contains a hole 22 having a diameter of about 2 mm at an angle of about 20° to the plane of the removable blade 21 (FIG. 2). The boss 23 contains a blind tapped opening 24 which is about 2.5 mm deep and is tapped for 4–40 threads.

The wire guide aperture 50 extending through the cutter blade 21 adjacent to the cutting edge serves the same purpose as similar holes that have been provided in the prior art.

In use, when the blade 21 dulls, the set screw in tapped opening 24 is loosened and the insert 21 is removed and easily replaced.

The novel assembly of FIGS. 2 to 7 can directly replace the original blade of FIG. 1 in the ultrasonic bonder. However, the unit cost of the new insert type cutting blade is about $5.00 compared to $34.00 for the solid blade of FIG. 1, producing an annual saving of 1,825.00 per cutting head.

The following is a cost Table comparing the original blade of FIG. 1 to the new insert type cutting blade.

|  | Cost of Blades | Annual Usage | Annual Cost Per Machine |
| --- | --- | --- | --- |
| Original Integral Cutting Blade | $34.00 | 365 | $12,410.00 |
| Insert Type Cuffing Blade | $5.00 | 365 | $1,825.00 |
| Savings Acquired | $29.00 | — | $10,585.00 |

Other ancillary benefits have been found when using the novel insert type cutting blade:

1. Improved wire tail control. The original cutting blade would allow the user to adjust the tail length too short, resulting in occasional electrical yield loss due to over deformation of the bond foot. This cannot occur with the blade 21 of the invention.
2. The new blade 21 is preferably made of carbide material. A cutter made of carbide has a life span 10 times that of the standard steel material of the prior art integral assembly.

Thus, the new insert type cutting blade is cost effective, and has been proven to be a good alternative to the original one piece cutting blade. Although he insert type cutting blade has an initial cost incurred, it will pay for itself within one week of production savings.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A cutting blade structure for wire bond apparatus for applying conductive wire to semiconductor die and to a terminal therefor, and for cutting said wire after the bonding thereof to said die and terminal; said cutting blade structure comprising a blade support body which is removably attachable to the wire bond apparatus and a cutter blade removably connected to said blade support body; said cutter blade having a cutting edge at one end thereof and a support shaft extending therefrom; said blade support body having an aperture therein for slidably receiving said support shaft; a clamp that removably clamps said support shaft within said aperture in said support body; and said cutter blade has a wire guide aperture extending therethrough and exiting at a point adjacent to said cutting edge.

2. The cutting blade structure of claim 1 wherein said blade support body includes a thin flat body structure having an enlarged surface for clamping to a movable head of a bonding apparatus.

3. The cutting blade structure of claim 1 wherein said cutter blade is a carbide arid said blade support body is steel.

4. The cutting blade structure of claim 1, in which the clamp comprises a set screw that is movable in a direction approximately perpendicularly to the support shaft of the cutter blade.

* * * * *